US008457215B2

(12) United States Patent
Son et al.

(10) Patent No.: US 8,457,215 B2
(45) Date of Patent: Jun. 4, 2013

(54) APPARATUS AND METHOD FOR SUPPRESSING NOISE IN RECEIVER

(75) Inventors: Beak-Kwon Son, Gyeonggi-do (KR); Sang-Ki Kang, Gyeonggi-do (KR); Dong-Won Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 731 days.

(21) Appl. No.: 12/644,301

(22) Filed: Dec. 22, 2009

(65) Prior Publication Data
US 2010/0158137 A1     Jun. 24, 2010

(30) Foreign Application Priority Data
Dec. 22, 2008   (KR) ..................... 10-2008-0131316

(51) Int. Cl.
*H04B 1/10*   (2006.01)

(52) U.S. Cl.
USPC .......... 375/254; 375/227; 375/345; 375/346; 375/316; 375/285; 455/570; 455/67.13; 455/67.11; 455/202; 455/218; 455/221; 455/22; 455/296; 455/501; 455/63.1; 455/136

(58) Field of Classification Search
USPC .. 375/254, 345, 346, 316, 285, 227; 455/570, 455/67.13, 67.11, 202, 218, 221, 22, 296, 455/501, 63.1, 135
See application file for complete search history.

(56) References Cited

U.S. PATENT DOCUMENTS

| | | | | |
|---|---|---|---|---|
| 5,852,630 A | * | 12/1998 | Langberg et al. | 375/219 |
| 6,463,414 B1 | * | 10/2002 | Su et al. | 704/270.1 |
| 7,225,001 B1 | * | 5/2007 | Eriksson et al. | 455/570 |
| 7,457,757 B1 | * | 11/2008 | McNeill et al. | 704/500 |
| 8,032,359 B2 | * | 10/2011 | Shlomot et al. | 704/201 |
| 2002/0019733 A1 | * | 2/2002 | Erell | 704/225 |
| 2006/0270467 A1 | * | 11/2006 | Song et al. | 455/570 |
| 2007/0237271 A1 | * | 10/2007 | Pessoa et al. | 375/346 |
| 2008/0239165 A1 | * | 10/2008 | Yamashita | 348/725 |
| 2011/0033055 A1 | * | 2/2011 | Low et al. | 381/56 |

FOREIGN PATENT DOCUMENTS

KR  10-2005-0030806   3/2005

* cited by examiner

*Primary Examiner* — Siu Lee
(74) *Attorney, Agent, or Firm* — Stanzione & Kim, LLP

(57) ABSTRACT

A receiver suppresses noise simultaneously using a noise suppressor and an automatic gain controller (AGC). The receiver divides a received signal into an audio period and a non-audio period, analyzes whether the noise characteristic of the non-audio period corresponds to a non-static noise or a static noise, and if the noise characteristic corresponds to the static noise, analyzes whether the static noise is caused by a network or a transmitter side terminal. In accordance with the analyzed noise characteristic, the noise suppressor firstly suppresses the noise by determining the noise suppressing intensity, and sends a signal, from which the noise has been firstly suppressed, to the AGC. The AGC secondly suppresses the noise included in the signal. In this case, the threshold value of the AGC is controlled in real time in accordance with the noise characteristic. Also, since the noise level is lowered by the first noise suppressing, the threshold value of the AGC can be set to a lower value, and thus a swing phenomenon and a radiotelegraph phenomenon can be reduced.

24 Claims, 6 Drawing Sheets

APPARATUS AND METHOD FOR SUPPRESSING NOISE IN RECEIVER

CROSS-REFERENCE TO RELATED APPLICATIONS

This application claims the priority under 35 U.S.C. §119 (a) of an application entitled "Apparatus And Method For Suppressing Noise In Receiver" filed in the Korean Industrial Property Office on Dec. 22, 2008 and assigned Serial No. 10-2008-0131316, the contents of which are hereby incorporated by reference.

BACKGROUND

1. Field of the Invention

The present general inventive concept relates to an apparatus and a method for suppressing noise in a receiver, and more particularly, to an apparatus and a method for suppressing noise in a receiver that uses an automatic gain controller.

2. Description of the Related Art

In a communication system, a signal transmitted from a transmitting side is finally transmitted to a terminal of a receiving side through a wired or wireless network. In this case, the core technology to heighten the communication quality is to suppress noise that is generated during a transmitting/receiving process. The noise generated in a signal that is finally received in a receiver is roughly classified into a transmitting side noise generated in a transmitting side (terminal) and a network noise generated as the signal passes through a network.

Typically, the network noise shows the characteristic of white noise, and in order to suppress the network noise, an automatic gain controller (AGC) is generally used in the receiver.

FIG. 1 is a view illustrating the configuration for outputting an audio signal in a receiver that includes an AGC.

A signal that is encoded in and transmitted from a transmitting side is input to a receiving terminal through a network. That is, the signal transmitted through the network is input to a decoder 101 through an antenna of the receiver. The decoder 101 decodes packets of the signal encoded in the transmitting side into a pulse coded modulation (PCM) signal. An AGC 103 automatically controls the gain of the receiver so that an amplitude of an output signal is kept constant through detection of amplitude variation of the decoded PCM signal. A digital receiving volume controller (Rx Volume) 105 controls the gain value of the output signal of the AGC 103 when a receiving side user controls the volume of a terminal. A codec gain controller 107 controls the gain of a codec at a proper level with respect to the output signal of the digital receiving volume controller 105, and a gain-controlled signal is converted into an analog signal by a digital-to-analog (D/A) converter 109 to be output through an amplifier 111.

Here, the operation of the AGC 103 that suppresses the network noise by controlling a noise gate threshold value and a noise gate slope will be described with reference to FIG. 2.

FIG. 2 is a view explaining a method of suppressing a network noise using a noise gate slope and a noise gate threshold value in an AGC.

Referring to FIG. 2, a solid line indicates a noise gate slope, and a noise gate threshold value 22 means a boundary point at which the noise gate slope is differently set. The noise gate slope 29 on the left side of the noise gate threshold value 22 is set to be higher than the noise gate slope 27 on the right side of the noise gate threshold value. In accordance with the noise gate slope set as described above, the ratio of an input to an output of a signal 21 having a level lower than the noise gate threshold value 22 becomes smaller than the ratio of an input to output of a signal having a level higher than the noise gate threshold value 22. Accordingly, the signal having a level lower than the noise gate threshold value 22 has a reduced gain after it passes through the AGC, and thus the signal level is also lowered.

The AGC suppresses the network noise by using the characteristics of the noise gate slope and the noise gate threshold value. That is, the AGC can reduce the level of the network noise by setting the noise gate threshold value to a value higher than the network noise level that is measured in advance and setting the network noise level to a desired level.

However, in the process of suppressing the network noise through the AGC, a radiotelegraph phenomenon and a swing phenomenon may occur to deteriorate the call quality. The radiotelegraph phenomenon means a phenomenon of noise disappearing with generation of "whistle" sound when the noise is suppressed by the AGC after voice call is completed, and the swing phenomenon means a phenomenon of sound rolling or disappearing of a specified phoneme of sound that is smaller than the noise gate threshold value level of the AGC during the operation of the AGC. The radiotelegraph phenomenon and the swing phenomenon notably occur in a quiet environment such as midnight call in a low voice.

In general, an audio encoder of a transmitter side terminal includes a noise suppressor. The noise suppressor can almost completely suppress static noise that is generated in the transmitter side terminal, but it is difficult for the noise suppressor to completely suppress non-static noise. The static noise means noise that maintains a constant level in the whole frequency band, such as white noise, and the non-static noise means noise the level of which is changed in accordance with the frequency band. The non-static noise, which has not been suppressed, has an increased noise level as it passes through the noise suppressor. Consequently, once the noise generated in the transmitter side passes through the noise suppressor, the static noise is suppressed, but the non-static noise becomes larger.

On the other hand, as the signal on the transmitter side passes through the network, the level of the non-static noise becomes higher, and the static noise occurs even in the network. Accordingly, the noise that reaches a receiver becomes larger since the non-static noise having a heightened level and the static noise occurring in the network are added together. In order to suppress the noise of a high level as described above, the noise gate threshold value and the noise gate slope of the AGC are set to higher values, and this causes the radiotelegraph phenomenon and the swing phenomenon occur notably.

Also, once the noise gate threshold value is set to a fixed value, it is difficult to reflect the change of the noise level therein, and thus the noise is not efficiently suppressed.

SUMMARY

The present general inventive concept provides an apparatus and a method for suppressing noise in a receiver, which can reduce a swing phenomenon and a radiotelegraph phenomenon occurring in a noise suppressing process in the receiver.

The present general inventive concept also provides an apparatus and a method for suppressing noise in a receiver, which can set a noise gate threshold value and a noise gate slope to small values in an automatic gain controller (AGC).

The present general inventive concept also provides an apparatus and a method for suppressing noise in a receiver, which can set a noise gate threshold value through reflection of the change of a noise level in an AGC.

The present general inventive concept also provides an apparatus and a method for suppressing noise in a receiver, which can firstly suppress noise by a noise suppressing intensity determined in accordance with the noise characteristic of a non-audio period, and secondly suppress noise by a noise gate threshold value of an AGC controlled in accordance with a noise level and the noise characteristic.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an apparatus to suppress noise in a receiver, which includes a noise analyzer to determine whether a current frame period of a received signal is a non-audio period using bit rate information of the current frame period, and analyze the noise characteristic of the received signal if the current frame period is the non-audio period, and a noise suppressor to determine the suppressing intensity of a noise included in the received signal in accordance with the analyzed noise characteristic, and suppress the noise included in the received signal in accordance with the determined suppressing intensity.

The noise analyzer may judge whether the noise characteristic of the received signal, which has been determined to be the non-audio period, corresponds to a static noise or a non-static noise, and in the case in which the noise characteristic of the received signal corresponds to the static noise, the noise analyzer may decide that the characteristic of the static noise corresponds to a transmitter side static noise if energy of the static noise exceeds a predetermined threshold value, while the noise analyzer may decide that the characteristic of the static noise corresponds to a network static noise if the energy of the static noise does not exceed the predetermined threshold value.

The noise suppressor sets the noise suppressing intensity to a minimum intensity if the noise characteristic of the received signal that is determined to be the non-audio period is the non-static noise, sets the noise suppressing intensity to a maximum intensity if the noise characteristic of the received signal that is determined to be the non-audio period is the network static noise, and sets the noise suppressing intensity to a predetermined intensity between the minimum intensity and the maximum intensity if the noise characteristic of the received signal that is determined to be the non-audio period is the transmitter side static noise.

The foregoing and/or other aspects and utilities of the present general inventive concept may also be achieved by providing a method of suppressing noise in a receiver, including determining whether a current frame period of a received signal is a non-audio period using bit rate information of the current frame period; analyzing the noise characteristic of the received signal if the current frame period is the non-audio period; determining the suppressing intensity of a noise included in the received signal in accordance with the analyzed noise characteristic; and suppressing the noise included in the received signal in accordance with the determined suppressing intensity.

The analyzing of the noise characteristic may include judging whether the noise characteristic of the received signal, which has been determined to be the non-audio period, corresponds to a static noise or a non-static noise; and in the case in which the noise characteristic of the received signal corresponds to the static noise, deciding that the characteristic of the static noise corresponds to a transmitter side static noise if energy of the static noise exceeds a predetermined threshold value, while deciding that the characteristic of the static noise corresponds to a network static noise if the energy of the static noise does not exceed the predetermined threshold value.

The determining of the noise suppressing intensity may include setting the noise suppressing intensity to a minimum intensity if the noise characteristic of the received signal that is determined to be the non-audio period is the non-static noise, includes the step of setting the noise suppressing intensity to a maximum intensity if the noise characteristic of the received signal that is determined to be the non-audio period is the network static noise, and includes the step of setting the noise suppressing intensity to a predetermined intensity between the minimum intensity and the maximum intensity if the noise characteristic of the received signal that is determined to be the non-audio period is the transmitter side static noise.

The foregoing and/or other aspects and utilities of the present general inventive concept may also be achieved by suppressed the noise by analyzing in real time the noise characteristic of the non-audio period and determining the noise suppressing intensity in accordance with the noise characteristic, and then reducing the noise level of the signal input to the AGC such that swing phenomenon and radiotelegraph phenomenon are greatly reduced.

The foregoing and/or other aspects and utilities of the present general inventive concept may also be achieved by providing an apparatus to suppress a noise of a received signal in a receiving apparatus, including a noise suppressor to suppress the noise included in the received signal according to bit rate information of the received signal.

The bit information may include a characteristic of the noise and a characteristic of a frame of the received signal.

The characteristic of the noise may include a static noise or a non-static noise, and the characteristic of the frame may include an audio frame period or a non-audio frame period.

The apparatus may further include an AGC to control a noise gate threshold value, to adjust intensity of the received signal, and to suppress a remaining noise of the noise suppressed in the received signal.

The apparatus may further include a decoder to decode the received signal and to generate a PCM signal of the received signal and frame information correspond to the bit information, wherein the noise suppressor suppresses the noise included in the PCM signal of the decoded signal according to bit rate information of the received signal.

The apparatus may further include a noise analyzer to generate the bit information according to a characteristic of the frame of the received signal.

The characteristic of the frame of the received signal may include an audio period and a non-audio period.

The characteristic of the frame of the received signal may include a non-static noise, a network static noise, and a transmitter static noise.

The foregoing and/or other aspects and utilities of the present general inventive concept may also be achieved by providing a method of suppressing a noise of a received signal in a receiving apparatus, the method including suppressing the noise included in the received signal according to bit rate information of the received signal.

The foregoing and/or other aspects and utilities of the present general inventive concept may also be achieved by providing a computer-readable medium to contain computer-readable codes as program to perform a method of suppressing a noise of a received signal in a receiving apparatus, the method including suppressing the noise included in the received signal according to bit rate information of the received signal The foregoing and/or other aspects and utilities of the present general inventive concept may also be achieved by providing an apparatus to suppress a noise of a received signal, including an extractor to extract the received signal from an input signal, and a first processor to suppress the noise included in the received signal according to bit rate information of the received signal.

The apparatus may further comprise a second processor to process data extracted from the extractor, wherein the received signal is an audio signal and the data is different from the audio signal and is one of video data and text data.

The foregoing and/or other aspects and utilities of the present general inventive concept may also be achieved by providing an apparatus to suppress a noise of a received signal, including a noise suppressor to suppress a noise of the received signal in a first noise processing operation according to at least one of a characteristic of the received signal and a characteristic of the noise, and an AGC to suppress a remaining noise of the received signal in which the first noise has been suppressed, in a second noise processing operation by adjusting a variable noise gate threshold value according to an energy level of the remaining noise or the characteristic of the noise.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE EMBODIMENTS

Figure 1:
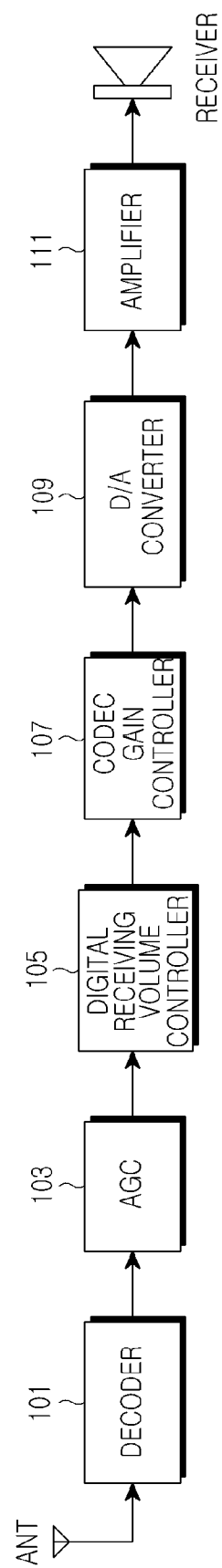
FIG. 1 is a view illustrating the configuration for outputting an audio signal in a receiver that includes an AGC.

Hereinafter, exemplary embodiments of the present general inventive concept will be described with reference to the accompanying drawings. In the following description, the same elements will be designated by the same reference numerals although they are shown in different drawings. Further, in the following description of the present general inventive concept, a detailed description of known functions and configurations incorporated herein will be omitted when it may make the subject matter of the present general inventive concept rather unclear.

According to the present general inventive concept, a receiver suppresses noise simultaneously using a noise suppressor and an automatic gain controller (AGC). The receiver may divide a received signal into an audio period and a non-audio period, analyzes whether a noise characteristic of the non-audio period corresponds to a non-static noise or a static noise, and if the noise characteristic corresponds to the static noise, analyzes whether the static noise is caused by a network or a transmitter side terminal. In accordance with the analyzed noise characteristic, the noise suppressor firstly suppresses the noise by determining the noise suppressing intensity, and sends a signal, from which the noise has been firstly suppressed, to the AGC. The AGC secondly suppresses the noise included in the signal. In this case, the threshold value of the AGC is controlled in real time in accordance with the noise characteristic. Also, since the noise level is lowered by the first noise suppressing, the threshold value of the AGC can be set to a lower value, and thus a swing phenomenon and a radiotelegraph phenomenon can be reduced.

Hereinafter, embodiments of the present general inventive concept will be described in detail.

Figure 3:
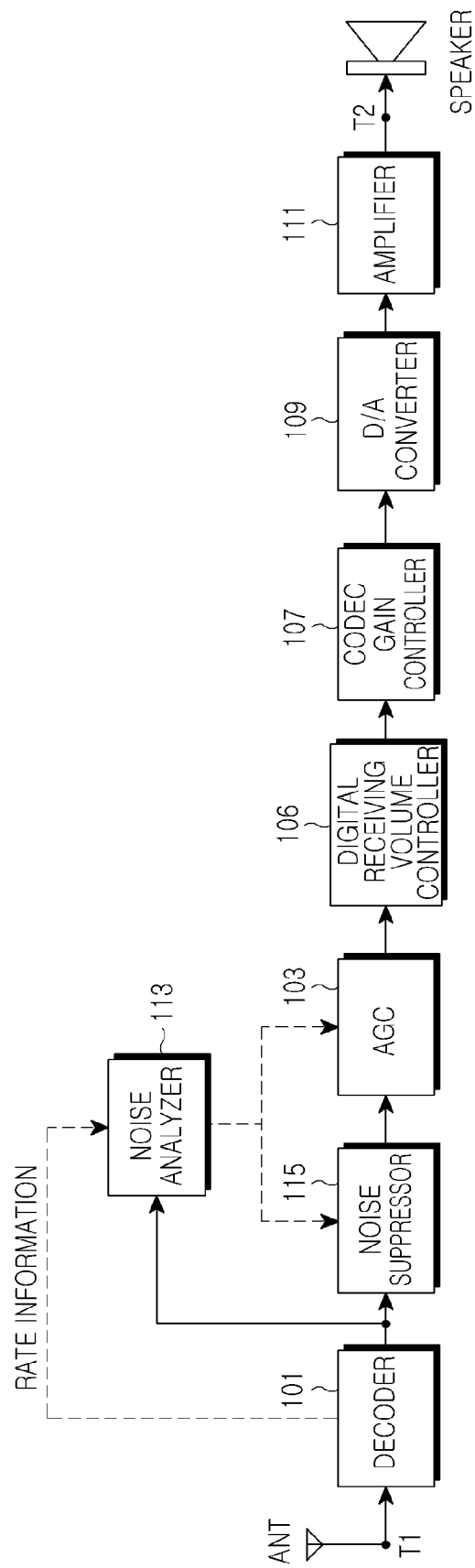
FIG. 3 is a view illustrating a receiver to suppress noise according to an embodiment of the present general inventive concept.

FIG. 3 is a view illustrating a receiver to control or adjust noise according to an embodiment of the present general inventive concept.

In FIG. 3, since general or conventional functions of a decoder 101, an automatic gain controller (AGC) 103, a digital receiving volume controller 106, a codec gain controller 107, a digital/analog (D/A) converter 109, and an amplifier 111 are similar to or the same as those as described above with reference to FIG. 1, the detailed description thereof will be omitted. The receiver according to the present general inventive concept may further include a noise analyzer 113 and a noise suppressor 115. The decoder 101 transfers frame information (i.e., rate information) of the decoder 101 and a decoded pulse code modulation (PCM) signal, which is an output signal of the decoder 101, to the noise analyzer 113.

The decoder 101 may receive the signal through an antenna ANT and a terminal T1 using a wireless communication method. However, the present general inventive concept is not limited thereto. It is possible that the terminal T1 may be connected to a wired communication line to receive the signal. A speaker can be directly connected to the amplifier 111. The speaker may be connected to the amplifier 111 through the terminal T2. The terminals T1 and T2 may be formed on a housing of the receiver to be connected to the decoder 101 and the amplifier 111, respectively.

The signal may be a signal having packets each formed in a unit of one or more frames. However, the present general inventive concept is not limited thereto. It is possible that the signal may be a signal having at least information regarding the frame or rate information. It is also possible that the signal can include information such that the decoder generates the frame or rate information according to a characteristic of the information included in the signal.

The decoder 101 decodes the signal (or packets included in the signal) to generate the PCM signal and also generate the frame or rate information during an operation of decoding the signal to represent a characteristic of the signal.

The noise analyzer 113 analyzes a noise characteristic of the frame information and the decoded PCM signal transferred from the decoder 101, and outputs the results thereof to the noise suppressor 115 and the AGC 103. The noise suppressor 115 controls or adjusts the intensity of noise of the signal to be suppressed according to the noise characteristic transferred from the noise analyzer 113.

The operation of the noise analyzer 113 will now be described in detail. The noise analyzer 113 may perform an operation of dividing the PCM signal into an audio period and a non-audio period in accordance with the bit rate of the decoder, and an operation of analyzing the noise characteristic in the audio and non-audio periods.

The operation of dividing the PCM signal into the audio period and the non-audio period will be described hereinafter.

The noise analyzer 113 divides the PCM signal into the audio period and the non-audio period in accordance with the bit rate of the decoder. If the PCM signal corresponds to the audio period, the frame of the audio period has a high bit rate that exceeds a predetermined level, and if the PCM signal corresponds to the non-audio period, the frame of the non-audio period has a low bit rate that does not exceed the predetermined level.

For example, in a case of Adaptive MultiRate (AMR) that is an audio coding method adopted in the standard of IMT-2000 asynchronous system, an audio period signal is transmitted in one mode of AMR__12.20 (12.20 kbit/s), AMR__10.20 (10.20 kbit/s), AMR__7.95 (7.95 kbit/s), AMR__7.40 (7.40 kbit/s), AMR__6.70 (6.70 kbit/s), AMR__5.90 (5.90 kbit/s), AMR__5.15 (5.15 kbit/s), and AMR__4.75 (4.75 kbit/s) in accordance with the bit rate, and a non-audio period signal is transmitted in a mode of AMR_SID (1.80 kbit/s). Accordingly, the non-audio period can be judged from mode information corresponding to the bit rate.

Since the signal may include the audio period signal and/or the non-audio period signal, and the each signal may be generated or transmitted according to the corresponding rate (i.e., kbit/s), the mode information is determined by the rate information (bit rate) which can be used to determine the non-audio period signal.

When a signal is coded according to the corresponding mode in a transmitter, the coded signal is transmitted to a receiver. When the received signal is decoded in the receiver, the receiver can recognize the mode and/or bit rate of the received signal to determine the audio period signal and/or the non-audio period signal. The received signal can be decoded in a decoder according to the corresponding bit rate.

The operation of analyzing the noise characteristic in the audio period and the non-audio period will be described hereinafter.

If the current frame period is the non-audio period as a result of judging whether the current frame period is the audio period or the non-audio period using the bit rate of the decoder, it is decided whether a noise characteristic of the PCM signal of the current non-audio period frame is a static noise or a non-static noise using the following method to be described later. On the other hand, if the current frame period is the audio period, a noise characteristic of the PCM signal in the audio period can be decided using an initial default value or the result of noise analysis in a previous non-audio period.

Although there may be various methods for analyzing the noise characteristic of the PCM signal of the non-audio period frame, three methods using energy of a signal will hereinafter be described as an example.

The first method is a method that uses an energy change rate of the non-audio period. That is, if an energy dispersion value of the corresponding frame does not exceed a predetermined threshold value, energy of the corresponding frame is kept constant, and then the noise characteristic is decided to correspond to the static noise. If the energy dispersion value of the corresponding frame exceeds the predetermined threshold value, the noise characteristic is decided to correspond to the non-static noise.

The second method is a method that uses an energy change rate of a frequency signal of the non-audio period. That is, the signal of the non-audio period is converted into a frequency domain signal using fast Fourier transform (FFT), energy for each frequency band is obtained, and a dispersion value of the each frequency band energy is calculated. If the dispersion value of the frequency band energy does not exceed a predetermined threshold value for each frequency band, it is decided that the noise characteristic corresponds to the static noise, while if the dispersion value exceeds the predetermined threshold value, it is decided that the noise characteristic corresponds to the non-static noise.

The third method decides whether the noise of the current non-audio period is the static noise or the non-static noise by comparing a statistical model of the network noise of the existing communication network with the statistical value of the non-audio period of the currently received signal.

If the noise characteristic of the non-audio period is decided to correspond to the static noise, the noise analyzer 113 decides whether the static noise is generated by a transmitter side background noise or generated in a network during transmission of the signal. That is, if the energy of the static noise exceeds the predetermined threshold value, the noise analyzer 113 decides that the static noise is the transmitter side static noise generated by the transmitter side background noise, and if the energy of the static noise does not exceed the predetermined threshold value, the noise analyzer 113 decides that the static noise is the network static noise generated in the network. This is, the above-described decision is made using the property that the energy of the transmitter side static noise is higher than the energy of the network static noise.

For reference, although in the description of the background art as described above, it is exemplified that the transmitter side static noise is suppressed by the noise suppressor, the reason why the transmitter side Static noise is considered in the present invention is that the transmitter side static noise may be included in the signal received in the receiver if the transmitter side static noise is not completely suppressed or the transmitter does not use the noise suppressor.

Hereinafter, the operation of the noise suppressor 115 will be described.

The noise suppressor 115 controls the noise suppressing intensity in accordance with the analysis result of the noise analyzer 113. In this case, if it is assumed that the audio and the noise are convolutively mixed in the signal input to the noise suppressor 115, the input signal x(t) of the noise suppressor 115 is expressed as in Equation (1) below.

$$x(t)=s(t)*n(t) \quad (1)$$

Here, s(t) denotes an audio signal, and n(t) denotes a noise.

By performing a frequency conversion with respect to Equation (1), Equation (1) is expressed as in Equation (2) below.

$$X(f)=S(f) \times N(f) \quad (2)$$

In the embodiment of the present invention, the noise suppressor 115 will multiply the term X(f) in Equation (2) by a predetermined gain G(f) in order to suppress the actual noise N(f). However, since the noise suppressor 115 is not aware of the current actual noise N(f), in the embodiment of the present invention, a method for obtaining an estimated noise N'(f) of the actual noise N(f) is used.

In order to obtain the estimated noise, the noise suppressor 115 uses a signal-to-noise ratio (SNR) of the received signal. On the other hand, in order to obtain the estimated noise by reflecting the noise characteristic through the analysis of the noise analyzer 113, the noise suppressor 115 calculates the estimated noise including an adaptive coefficient μ. The adaptive coefficient μ may be differently set in accordance with the noise characteristic. This is expressed as in Equation (3).

$$N'(f) = \frac{SNR(f) + \mu}{SNR(f)} \qquad (3)$$

In a case when the term G(f) is a reciprocal number of N'(f), this is expressed as in Equation (4).

$$G(f) = 1/N'(f) \qquad (4)$$

or $$G(f) = \frac{SNR(f)}{SNR(f) + \mu}$$

By multiplying the signal including the noise in Equation (2) X(f) by G(f) as described above, a noise-suppressed audio signal S'(f) can be obtained. This is expressed as in Equation (5).

$$X(f) \times G(f) = S(f) \times N(f) \times (1/N'(f)) \cong S'(f) \qquad (5)$$

The procedure expressed as in Equations (3) to (5) can be applied to the static noise of which the noise characteristic is constant in the course of time. However, the noise characteristic can correspond to the non-static noise that is changed with respect to a time axis. In this case, it may not be easy to estimate N'(f), and thus it may also not be easy to calculate the gain value G(f). Accordingly, the noise is not suppressed up to a desired level, and also the audio signal may be distorted.

The noise suppressor 115 suppresses the noise without generating audio distortion by differently setting the gain value G(f) in accordance with the result of the noise characteristic decision of the noise analyzer 113. The detailed method is as follows.

If the SNR is high, the energy of the audio signal is very high in comparison to the noise energy, and the noise suppressing intensity is lowered by making the gain value G(f) nearly 1. If the SNR is low, the noise energy is in a high state, and thus the noise suppressing intensity is maximized by making the gain value G(f) nearly 0. Here, since the SNR is a value that can be changed by the noise suppressor 115, the noise suppressor 115, in order to control the gain value, controls the value μ in accordance with the result of noise characteristic analysis of the noise analyzer 113. The method for controlling the value μ in accordance with the noise characteristic analysis of the noise analyzer is as follows.

If the noise of the non-audio period is the non-static noise, it is required to minimize the noise suppressing intensity since if the noise suppressing is set to a high value, audio distortion may occur in this process. In this case, the non-static noise may be a noise generated in the non-audio period at a transmitter. Accordingly, in order to set the gain value G to nearly 1, it is required to set the value μ to nearly 0. At this time, the value μ is defined as μ=μ$_{nonstationary}$, and the value μ$_{nonstationary}$ may differ depending upon the system.

If the noise of the non-audio period is the network static noise, which has low energy, the audio distortion scarcely occurs even if the noise suppressing intensity is set to a high value. Accordingly, in order to make the value G nearly 0, it is required to set the value μ to a large value. At this time, the value μ is set to μ=μ$_{network}$, and the value μ$_{network}$ may differ depending upon the system.

If the noise of the non-audio period is the transmitter side static noise, which has an energy value larger than that of the network static noise, audio distortion may occur in this process in the case in which the noise suppressing intensity is maximized. Accordingly, it is required to set the noise suppressing intensity to a constant level between the network static noise suppressing intensity and the non-static noise suppressing intensity. It is possible that the value G is set to the extent that about 80% of the transmitter side static noise can be suppressed. At this time, the value μ is defined as μ=μ$_{stationary}$, and the value μ$_{stationary}$ may differ depending upon the system.

As described above, the signal, in which the noise has been suppressed in accordance with the noise characteristic, is input to the AGC 103, and the remaining noise is suppressed through the noise gate of the AGC 103. The remaining noise may be the noise which has not been suppressed in the noise suppressor 115.

Figure 2:
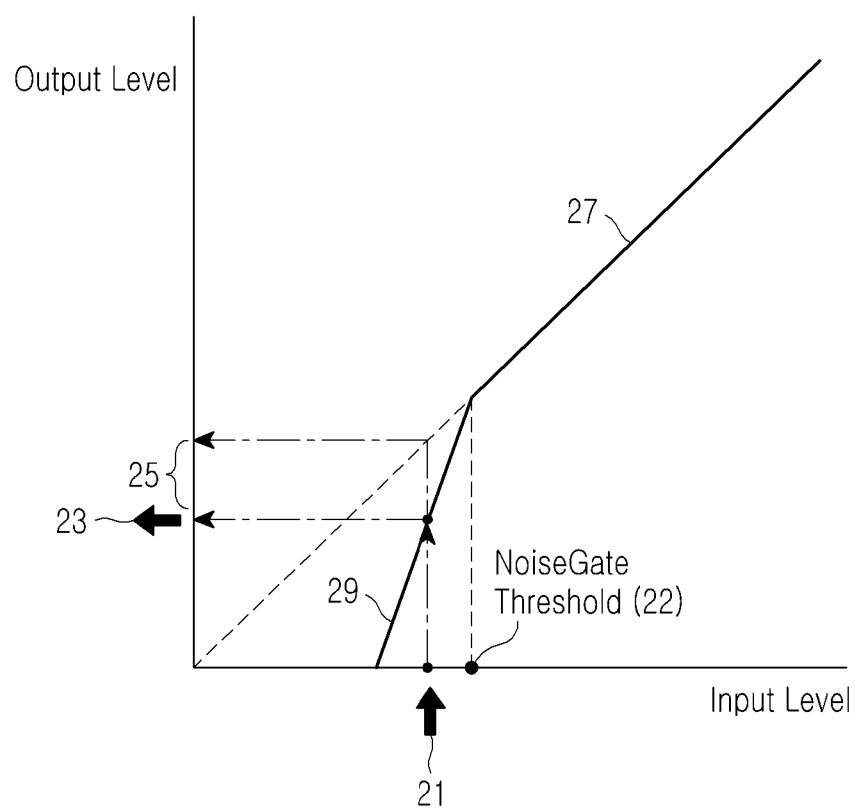
FIG. 2 is a view explaining a method of suppressing a network noise using a noise gate slope and a noise gate threshold value in an AGC.

That is, a value of a noise gate threshold of the noise gate of the AGC 113 is set to be changed in real time in consideration of the energy level of the remaining noise after the noise is suppressed to a predetermined level by the noise suppressor 115. The noise gate threshold value can be set in real time in accordance with the noise characteristic analyzed by the noise analyzer 113. In the case of the network static noise, the energy level of the noise is lowered after the noise passes through the noise suppressor 115, and thus it is possible to set the noise gate threshold value of the AGC 103 to a value smaller than that of the conventional AGC as illustrated in FIG. 2. Accordingly, the intensity of the audio signal to be suppressed by the AGC 103 can be lowered, and thus the swing phenomenon can be improved. Also, since the amount of noise that is suppressed by the AGC 103 becomes smaller than that of the conventional AGC, the radiotelegraph phenomenon can be relieved.

Figure 4:
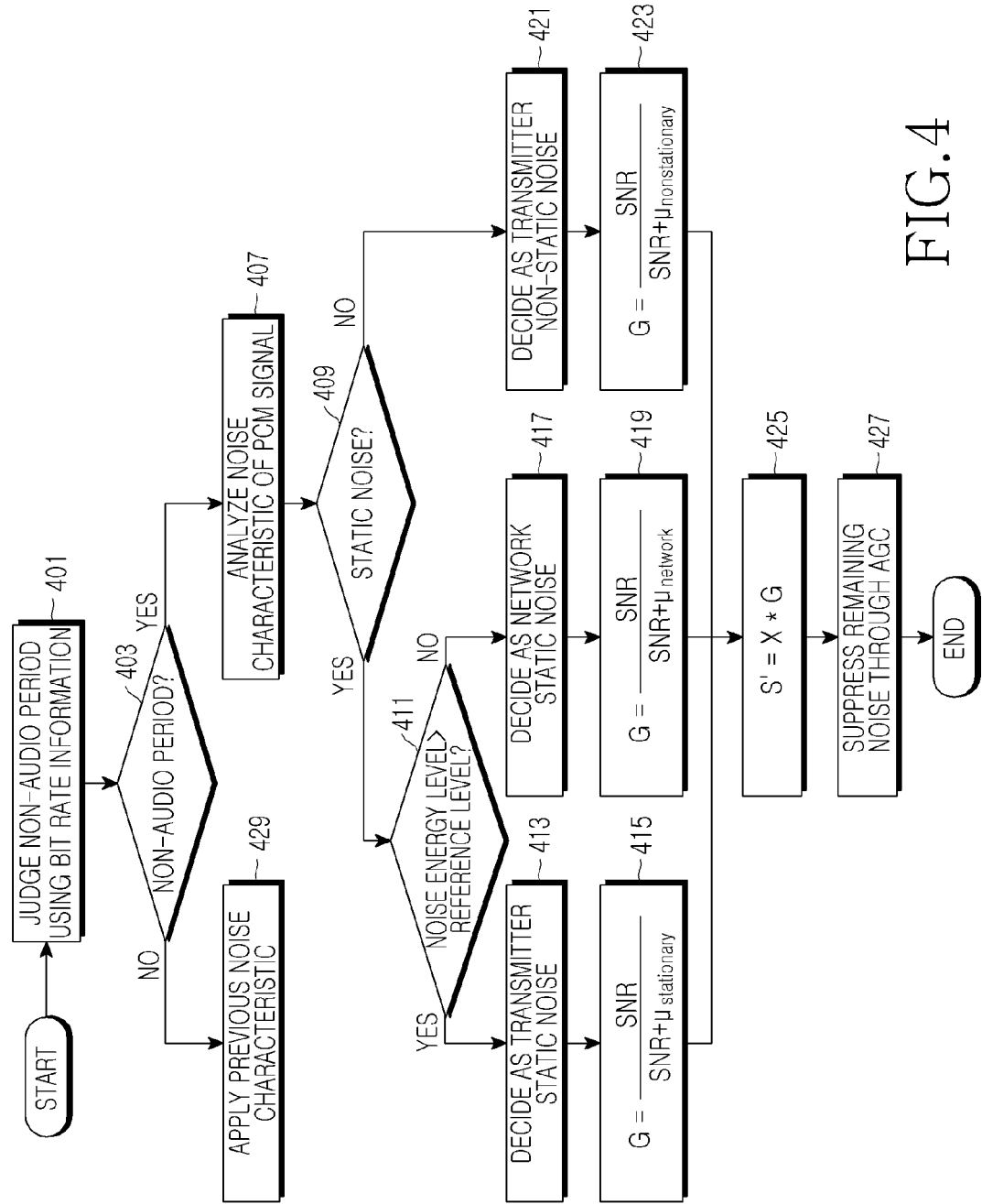
FIG. 4 is a view illustrating a method of suppressing noise in a receiver according to an embodiment of the present general inventive concept.

FIG. 4 is a view illustrating a method of suppressing noise in a receiver according to an embodiment of the present general inventive concept.

In operation 401, it is judged whether the currently input PCM signal is a non-audio period signal using the bit rate information of the noise analyzer. If the PCM signal is not the non-audio period signal, i.e. if the PCM signal is an audio period signal, in operation 403, operation 429 is performed to apply the noise characteristic by the previous noise analysis.

On the other hand, if the PCM signal is the non-audio period signal, operation 407 is performed to analyze the noise characteristic of the PCM signal, and if the analyzed noise characteristic corresponds to the static noise in operation 409, operation 411 is performed. On the other hand, if the noise characteristic does not correspond to the static noise, i.e. if the noise characteristic corresponds to the non-static noise, operation 421 is performed to decide the noise characteristic of the current PCM signal as the transmitter side non-static noise. Then, the gain value G is calculated by the noise suppressor through setting of the adaptive coefficient to μ$_{nonstationary}$ in operation 429, and then operation 425 is performed to suppress the noise.

In the operation 411, it is judged whether the energy level of the static noise is higher than a predetermined reference value, and if the energy level of the static noise is higher than the predetermined reference value, operation 413 is performed to decide the noise characteristic of the PCM signal as the transmitter side static noise. In operation 415, the gain value G is calculated by the noise suppressor through setting of the adaptive coefficient to μ$_{stationary}$, and then the operation 425 is performed to suppress the noise.

On the other hand, if the energy level of the static noise of the current period does not exceed the reference value in the operation 411, operation 417 is performed to decide the static noise of the current period as the network static noise through the noise analyzer. Then, the gain value G is calculated by the noise suppressor through setting of the adaptive coefficient to μ$_{network}$ in operation 419, and then the operation 425 is performed to suppress the noise.

In operation 427, the remaining noise of the signal, from which the noise has been suppressed in accordance with the noise characteristic in at least one of the operations 415, 419, and 423, is suppressed. At this time, the AGC noise gate threshold value can be set to a value that is smaller than that of the conventional AGC as described above.

Figure 5A:
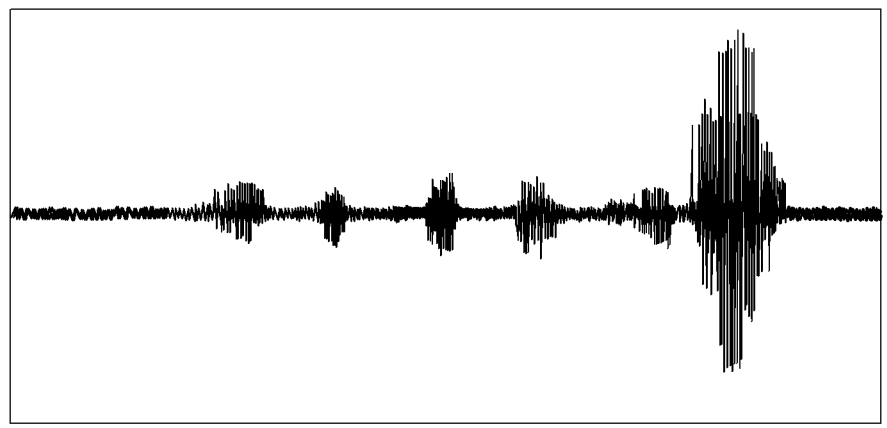
FIGS. 5A to 5C are views illustrating the results of suppressing noise using a noise suppressor and an AGC in a receiver according to an embodiment of the present general inventive concept.
Figure 5B:
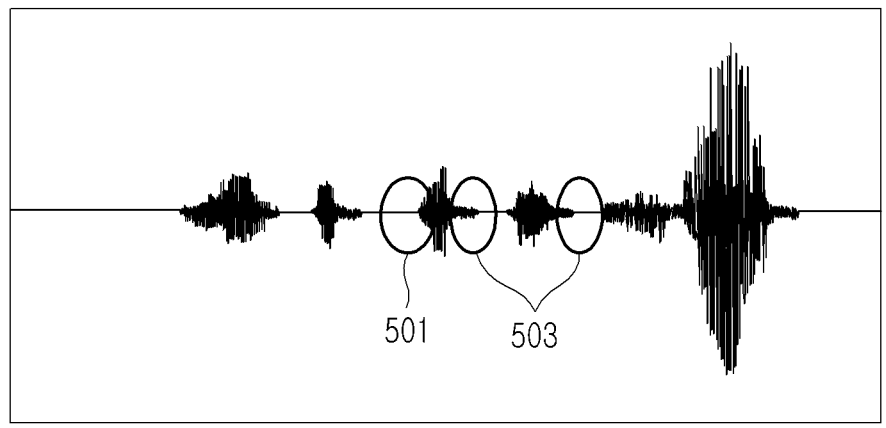
Figure 5C:
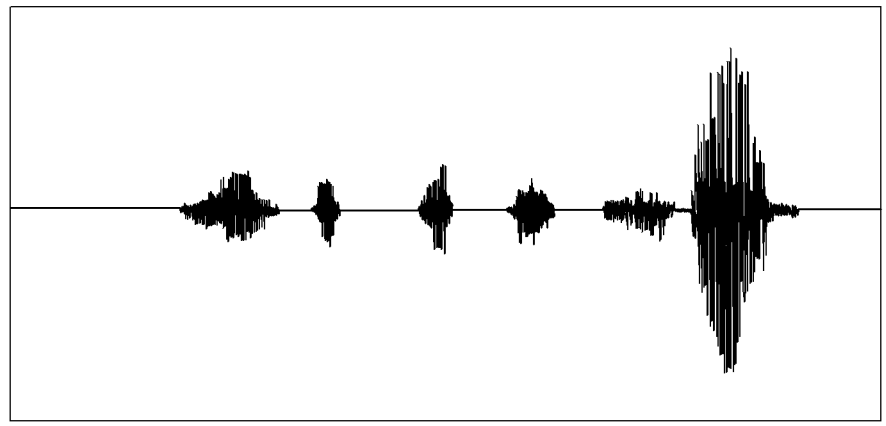

FIGS. 5A to 5C are views illustrating the results of suppressing noise using a noise suppressor and an AGC in a receiver according to an embodiment of the present general inventive concept.

FIG. 5A illustrates an audio signal that is mixed with the network static noise, FIG. 5B illustrates an audio signal from which the network static noise has been suppressed using only the conventional AGC, and FIG. 5C illustrates an audio signal from which the network static noise has been suppressed simultaneously using the noise suppressor and the AGC according to an embodiment of the present general inventive concept.

The reference numeral 501 in FIG. 5B indicates a swing phenomenon caused by the noise suppressing, and 503 indicates the occurrence of a radiotelegraph phenomenon due to an abrupt noise suppressing. By contrast, in FIG. 5C, the swing phenomenon and the radiotelegraph phenomenon can scarcely be seen.

Figure 6:
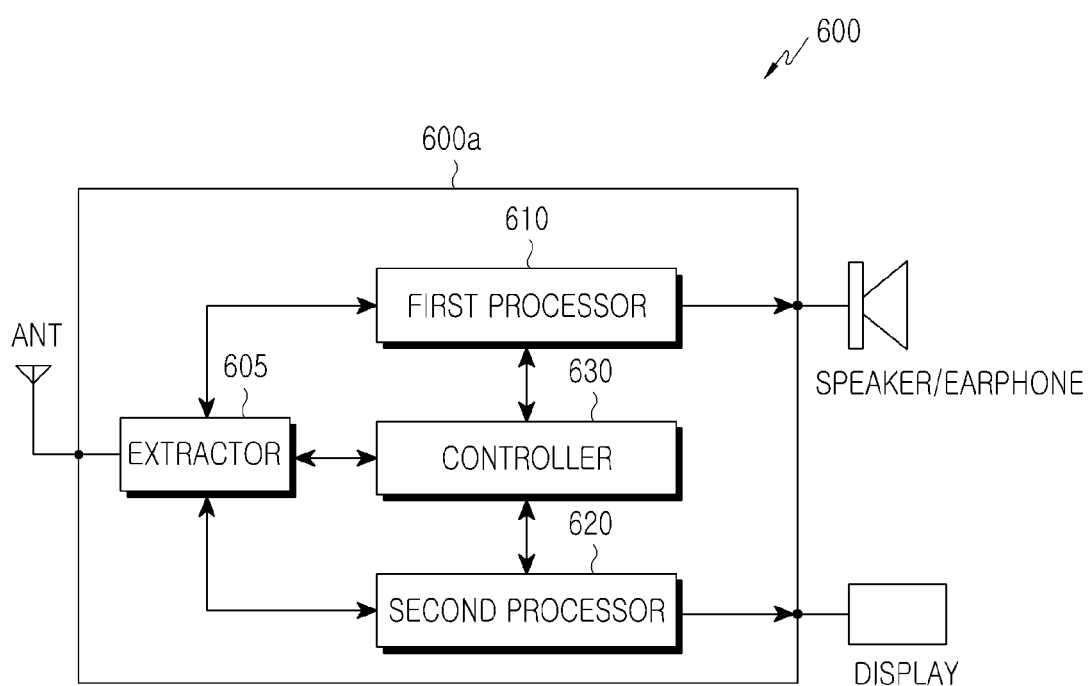
FIG. 6 is a view illustrating a receiver according to an embodiment of the present inventive concept.

FIG. 6 is a view illustrating an apparatus 600 according to an embodiment of the present general inventive concept. The apparatus 600 may include a first processor 610, a second processor 620, a controller 630, and an extractor 605. The first processor 610 may be a receiver which is similar or same as the receiver of the FIG. 3 to process an audio signal to be reproduced at the speaker or earphone which can be mounted on a housing 600a or connected to the housing 600a through a terminal. The first processor 610 may include the noise analyzer 113 and the noise suppressor 115. The noise analyzer 113 and the noise suppressor 115 may be a single unit to perform operations of the noise analyzer 113 and the noise suppressor 115. The second processor 620 may a video processor or a text (document) processor to process a video (text) signal which can be reproduced in a display which can be mounted on a housing 600a or connected to the housing 600a through a terminal. The first processor 610 and/or the second processor 620 may be a functional unit to perform a function of the apparatus 600.

If the apparatus 600 is a mobile phone or telecommunication device, at least one of the first processor 610 and the second processor 620 can include a user interface unit or a user input init, to generate a signal (or interface) to communicate with a user of the apparatus 600, to receive a user signal input from the user through the interface, and/or to process the input signal according to the user signal such that the audio signal or the video signal can be reproduced in the speaker/earphone or the display. The extractor 605 may be a unit to extract the video (text) signal and the audio signal from an input signal received through a signal input source, for example, an antenna. The extractor 605 may be a unit to divide the input signal into the audio signal and the video (text) signal. The controller 630 controls the operations of the first processor 610, the second processor 620, and the extractor 605.

The present general inventive concept can also be embodied as computer-readable codes on a computer-readable medium. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

According to the present general inventive concept, the noise is firstly suppressed by analyzing in real time the noise characteristic of the non-audio period and determining the noise suppressing intensity in accordance with the noise characteristic, and thus the noise level of the signal input to the AGC is reduced. Also, since the threshold value of the AGC is controlled in accordance with the noise level that is changed in real time and the noise characteristic, the swing phenomenon and the radiotelegraph phenomenon are greatly reduced in comparison to the case in which the noise is suppressed only by the AGC, and thus the call quality is improved with the subscriber's service satisfaction heightened.

Although a few embodiments of the present invention have been shown and described, it would be appreciated by those skilled in the art that changes may be made in these embodiments without departing from the principles and spirit of the general inventive concept, the scope of which is defined in the claims and their equivalents.

What is claimed is:

1. An apparatus to suppress noise in a receiver, comprising:
a noise analyzer to determine whether a current frame period of a received signal is a non-audio period using bit rate information of the current frame period, and to analyze a noise characteristic of the received signal if the current frame period is the non-audio period to determine whether the analyzed noise characteristic corresponds to a static noise or a non-static noise; and
a noise suppressor to determine a suppressing intensity of a noise included in the received signal in accordance with the analyzed noise characteristic and the determination of whether the analyzed noise characteristic corresponds to a static noise or a non-static noise, and suppress the noise included in the received signal in accordance with the determined suppressing intensity.

2. The apparatus as claimed in claim 1, wherein:
when the noise characteristic of the received signal corresponds to the static noise, the noise analyzer decides that the characteristic of the static noise corresponds to a transmitter side static noise if energy of the static noise exceeds a predetermined threshold value, while the noise analyzer decides that the characteristic of the static noise corresponds to a network static noise if the energy of the static noise does not exceed the predetermined threshold value.

3. The apparatus as claimed in claim 2, wherein the noise suppressor sets the noise suppressing intensity to a minimum intensity if the noise characteristic of the received signal that is determined to be the non-audio period is the non-static noise.

4. The apparatus as claimed in claim 2, wherein the noise suppressor sets the noise suppressing intensity to a maximum intensity if the noise characteristic of the received signal that is determined to be the non-audio period is the network static noise.

5. The apparatus as claimed in claim 2, wherein the noise suppressor sets the noise suppressing intensity to a predetermined intensity between the minimum intensity and the maximum intensity if the noise characteristic of the received signal that is determined to be the non-audio period is the transmitter side static noise.

6. The apparatus as claimed in claim 1, further comprising an automatic gain controller suppressing remaining noise included in an output signal of the noise suppressor by controlling in real time a noise gate threshold value in accordance with the analyzed noise characteristic.

7. A method of suppressing noise in a receiver, the method comprising:
    determining whether a current frame period of a received signal is a non-audio period using bit rate information of the current frame period;
    analyzing a noise characteristic of the received signal if the current frame period is the non-audio period;
    determining whether the analyzed noise characteristic corresponds to a static noise or a non-static noise;
    determining a suppressing intensity of a noise included in the received signal in accordance with the analyzed noise characteristic and the determination of whether the analyzed noise characteristic corresponds to a static noise or a non-static noise; and
    suppressing the noise included in the received signal in accordance with the determined suppressing intensity.

8. The method as claimed in claim 7, wherein the operation of analyzing the noise characteristic comprises:
    when the noise characteristic of the received signal corresponds to the static noise, deciding that a characteristic of the static noise corresponds to a transmitter side static noise if energy of the static noise exceeds a predetermined threshold value, while deciding that the characteristic of the static noise corresponds to a network static noise if the energy of the static noise does not exceed the predetermined threshold value.

9. The method as claimed in claim 8, wherein the operation of determining the noise suppressing intensity comprises setting the noise suppressing intensity to a minimum intensity if the noise characteristic of the received signal that is determined to be the non-audio period is the non-static noise.

10. The method as claimed in claim 8, wherein the operation of determining the noise suppressing intensity comprises setting the noise suppressing intensity to a maximum intensity if the noise characteristic of the received signal that is determined to be the non-audio period is the network static noise.

11. The method as claimed in claim 8, wherein the operation of determining the noise suppressing intensity comprises setting the noise suppressing intensity to a predetermined intensity between the minimum intensity and the maximum intensity if the noise characteristic of the received signal that is determined to be the non-audio period is the transmitter side static noise.

12. The method as claimed in claim 7, further comprising:
    controlling in real time the noise gate threshold value of an automatic gain controller in accordance with the analyzed noise characteristic; and
    suppressing the remaining noise included in the received signal from which the noise has been suppressed using the noise gate according to the controlled threshold value.

13. An apparatus to suppress a noise of a received signal in a receiving apparatus, comprising:
    a decoder to decode the received signal; and
    a noise suppressor to suppress the noise included in the decoded signal according to whether a characteristic of the noise of the decoded signal corresponds to a static noise or a non-static noise during a non-audio period set by bit rate information of the received signal.

14. The apparatus of claim 13, wherein the characteristic of the noise may comprise a characteristic of a frame of the received signal.

15. The apparatus of claim 14, wherein:
    the characteristic of the frame comprises an audio frame period or a non-audio frame period.

16. The apparatus of claim 13, further comprising:
    an AGC to control a noise gate threshold value, to adjust intensity of the received signal, and to suppress a remaining noise of the noise suppressed in the received signal.

17. The apparatus of claim 13, wherein the decoder decodes the received signal to generate a pulse code modulated (PCM) signal of the received signal and frame information correspond to the bit rate information, and
    wherein the noise suppressor suppresses a noise included in the PCM signal of the decoded signal according to the bit rate information of the received signal.

18. The apparatus of claim 13, further comprising:
    a noise analyzer to generate the bit rate information according to a characteristic of a frame of the received signal.

19. The apparatus of claim 18, wherein the characteristic of the frame of the received signal comprises an audio period and a non-audio period.

20. The apparatus of claim 18, wherein the characteristic of the frame of the received signal comprises a non-static noise, a network static noise, and a transmitter static noise.

21. A method of suppressing a noise of a received signal in a receiving apparatus, the method comprising:
    decoding the received signal; and
    suppressing the noise included in the decoded signal according to whether a characteristic of noise of the decoded signal corresponds to a static noise or a non-static noise during a non-audio period set by bit rate information of the received signal.

22. A non-transitory computer-readable medium to contain computer-readable codes as program to perform a method of suppressing a noise of a received signal in a receiving apparatus, the method comprising:
    decoding the received signal;
    suppressing the noise included in the decoded signal according to bit rate information of the decoded signal, the bit rate information comprising a characteristic of the noise of the decoded signal; and,
    determining whether the noise characteristic corresponds to a static noise or a non-static noise if it is determined that the noise characteristic of a current frame period of the decoded signal is a non-audio period.

23. An apparatus to suppress a noise of a received signal, comprising:
    an extractor to extract the received signal from an input signal;
    a first processor to suppress the noise included in the received signal according to bit rate information of the received signal depending on a characteristic of noise of the decided signal corresponds to a static noise or a non-static noise; and
    a second processor to process data extracted from the extractor,
    wherein the received signal is an audio signal and the data is different from the audio signal and is one of video data and text data.

24. An apparatus to suppress a noise of a received signal, comprising:
    a noise suppressor to suppress the noise of the received signal in a first noise processing operation according to a characteristic of the received signal and a characteristic of the noise if a current frame period of the received signal is a non-audio period to determine whether the noise characteristic corresponds to a static noise or a non-static noise; and
    an AGC to suppress a remaining noise of the received signal after the noise processing operation in which the first noise has been suppressed, in a second noise processing operation by adjusting a variable noise gate threshold value according to an energy level of the remaining noise or the characteristic of the noise.

\* \* \* \* \*